United States Patent [19]

Kogo et al.

[11] 4,298,965

[45] Nov. 3, 1981

[54] DIRECTIVITY DISPLAY DEVICE AND METHOD

[75] Inventors: Hiroshi Kogo, Ichikawa; Mamoru Tonooka, Ryugasaki; Teruhisa Aoki, Tokyo; Shigeo Ando, Minami-ashigara; Raiji Tomiyama, Yokohama, all of Japan

[73] Assignee: Nissan Motor Company, Limited, Kanagawa, Japan

[21] Appl. No.: 88,127

[22] Filed: Oct. 25, 1979

[30] Foreign Application Priority Data

Nov. 1, 1978 [JP] Japan .................................. 53-133743
Apr. 11, 1979 [JP] Japan ............................. 54-46912[U]

[51] Int. Cl.³ .......................................... H04R 29/00
[52] U.S. Cl. .................................. 367/13; 343/100 AP; 367/113

[58] Field of Search ................................ 367/13, 113; 343/100 AP, 703, 100 AD

[56] References Cited

U.S. PATENT DOCUMENTS 2,701,876  2/1955  Mottley et al. .............. 343/100 AP
3,622,961  11/1971  Vasiloff .................................. 367/13

Primary Examiner—Richard A. Farley
Attorney, Agent, or Firm—Lowe, King, Price & Becker

[57] ABSTRACT

A directivity display device and method are disclosed which involve a first saw-tooth generator producing a scan signal and a brilliance modulation circuit producing a brilliance modulated signal derived from the characteristic output of a test object with respect to a rotational angle of the test object. Thereby, the directivity display device makes it possible to display in graphic form a property of the test on a cathode-ray tube with a polar or other coordinate representation.

18 Claims, 11 Drawing Figures

DIRECTIVITY DISPLAY DEVICE AND METHOD

BACKGROUND OF THE INVENTION

The present invention relates to a directivity display device, and method and more particularly to a display device and method capable of directly depicting the directivity of, for example, an antenna for radio or television, speaker, microphone or luminous body, on a CRT screen (cathode-ray tube) type oscilloscope with a polar or other coordinate representation method.

In the prior art, a method for detecting a directivity of a test object such as a speaker or an antenna has been proposed, which comprises the steps of rotating the test object progressively through a predetermined angle, measuring the level of an output signal being supplied from the test object at each angle of rotation, and plotting the total measured result corresponding to each position on polar coordinate graph paper. Further, in place of plotting the measured result, methods have been suggested to depict the measured result indicating the directivity by means of a rotating recorder.

However, the above conventional methods require a lot of time and human labor in measurement. More particularly, the former method further requires much labor in processing the measured results, and the latter method, another drawback is that the required equipment is rather complicated.

SUMMARY OF THE INVENTION

With the above in mind, an object of the present invention is to provide a directivity display device and method which make it possible to effect a display indicative of directivity of a test object on a screen of a cathode-ray tube.

Another object of the present invention is to provide a polar coordinate display device and method which make it possible to effect direct viewing of a directivity of a test object with a simple circuit construction.

A still further object of the present invention is to provide a polar coordinate display device and method capable of eliminating noise which may be included in an output indicative of the rotational angle of a test object.

In a preferred embodiment of the present invention, there is provided a directivity display device and method in which a scan control circuit includes a first saw tooth generator and in which a brilliance modulation circuit comprises a first detector for detecting a DC voltage signal proportional to the rotational angle of a test object, a second detector for detecting a characteristic output at the given rotational angle of the test object, a second saw-tooth generator which represents the circumferential scan position, a first comparator which compares the output of the first detector with the output of the second saw-tooth generator to produce an output when the output of the second saw-tooth generator is above the output of the first detector, a second comparator which compares the output of the first saw-tooth generator with the output of the second detector to produce an output when the output of the second detector is above the output of the first saw-tooth generator, a first pulse generator responsive to the output of the first comparator to produce pulses, and a first analog switching circuit for switching the output of the second comparator in synchronization with the pulse output from the first pulse generator to produce an output serving as a brilliance modulated signal.

The polar display device according to the present invention includes a spiral scanning circuit comprising an invertor for inverting the output of the saw-tooth generator, a second analog switching circuit for switching the output of the first saw-tooth generator and the output of the inventor in synchronization with a signal having the same period as a scanning period to produce a first sine wave signal of which the amplitude linearly increases every scanning period within a frame period, and an output circuit directly outputting the first sine wave signal to a horizontal axis of the cathode-ray tube and a second sine wave signal of which the phase is shifted by 90° with respect to the first sine wave signal to the vertical axis of the cathode-ray tube.

According to another preferred embodiment of the present invention, there is provided a brilliance modulation circuit comprising a first detector for detecting a DC voltage signal proportional to a given rotational angle of a test object, a second detector for detecting a characteristic output at the given rotational angle of the test object, a second saw-tooth generator of which amplitude varies in synchronization with a scanning period, a first comparator which compares the output of the first detector with the output of the second saw-tooth generator to produce an output when the output of the second saw-tooth generator is above the output of said first detector, a second comparator which compares the output of the first saw-tooth generator with the output of the second detector to produce an output when the output of the second detector is above the output of the first saw-tooth generator, a first pulse generator responsive to the output of the first comparator to produce pulses, a second pulse generator responsive to the output of the second comparator to produce pulses, and an analog switching circuit for switching the pulse output from the second pulse generator in synchronization with the pulse output from the first pulse generator to produce an output serving as a brilliance modulated signal.

These and other objects and features of the invention will be apparent from the following description taken in conjunction with the accompanying drawings.

DESCRIPTION OF THE PREFERRED EMBODIMENTS

Figure 1:
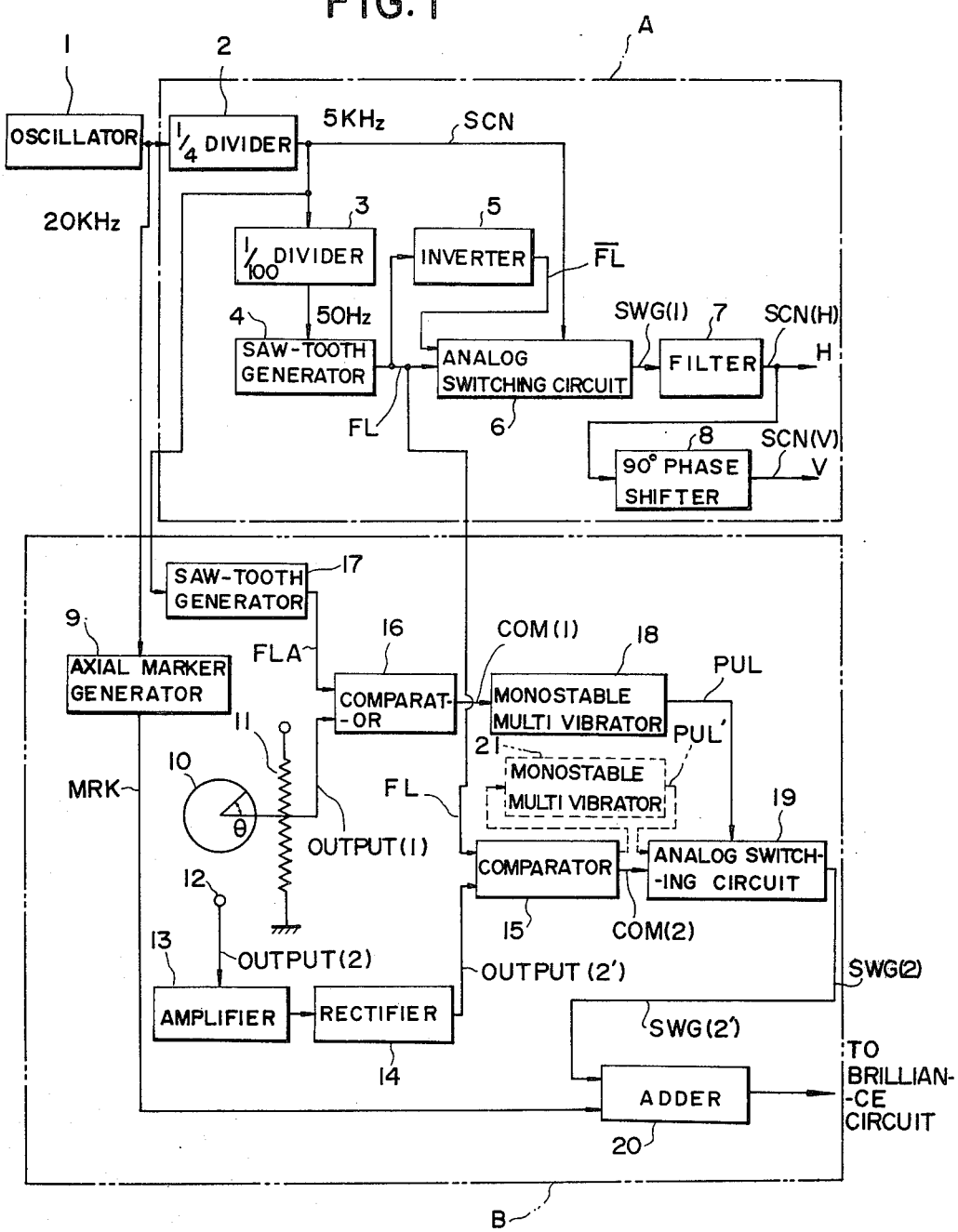
FIG. 1 is a diagrammatical view illustrating a polar coordinate displace device according to the present invention.

Referring to FIG. 1, symbol A denotes a spiral scan control circuit generating signals to draw a spiral raster on the screen of the CRT, and symbol B denotes a unit which measures the directional property of the test object and converts the measured signal into a brilliance modulation signal.

Using the Lissajous figure method, the spiral scanning is effected by applying two sine wave signals having a phase difference of 90° to the horizontal and vertical axes of the CRT. In the embodiment according to the present invention, the spiral scanning is effected by using a first sine wave signal of which the amplitude increases linearly every scanning period within the frame period and a second sine wave signal of which the phase is shifted by 90° with respect to the first sine wave signal.

In this particular example, the frame frequency is 50 Hz, the number of scanning lines is one hundred (the scanning frequency thereof is 5 KHz), and the diameter of the scanning screen is 10 cm.

Reference numeral 1 denotes an oscillator comprising a quartz crystal oscillator which produces a frequency of 20 KHz, and 2 denotes a ¼ frequency divider which divides the high frequency signal output from the oscillator 1 into a basic frequency signal of 5 KHz. The basic frequency signal of 5 KHz is inputted to a 1/000 divider 3 thereby to produce a signal of 50 Hz. Responsive to this signal, a saw-tooth wave generator 4 outputs a saw-tooth signal of 50 Hz.

A saw-tooth signal labelled by FL having a period of 20 ms which is outputted from the saw-tooth generator 4 represents the frame period of the spiral scanning.

The basic frequency signal labelled by SCN having a period of 0.2 ms which is outputted from the ¼ divider 2 represents the scanning period of the spiral scanning. The saw-tooth wave signal FL output from the saw-tooth wave generator 4 and a signal labelled by $\overline{FL}$ obtained by inverting the signal FL through an inverter 5 are input into an analog switching circuit 6. In this switching circuit 6, a switching operation on the inputs FL and $\overline{FL}$ is effected by the output SCN from the ¼ divider to produce an output labelled by SWG(1). The output SWG(1) is supplied into a band pass filter 7 which produces a sine wave signal SCN(H) modulated by the saw-tooth signal. The signal SCN(H) is applied to the horizontal axis of the CRT. The signal labelled by SNC(V) is obtained from the signal SNC(H) as an output of a phase shifter 8.

Thus, a spiral raster is drawn on a screen of the CRT, with a frame cycle of 20 ms, a scanning cycle is 0.2 ms, and thus a radial resolution of 100 lines.

In the prior art, as a means for making a sine wave signal for effecting a spiral scan with a scan period of 0.2 ms, a method has been proposed to modulate a sign wave signal by a saw-tooth wave with a frequency of 50 Hz.

However, with the conventional method, the amplitude of the modulated sine wave does not increase linearly because the output characteristics of the transistor constituting a modulator are not exactly linear but become exponential when the intput signal is small. Thereby, the display is marred because the scan lines tend to become crowded at the center position of the spiral scan.

To eliminate this inconvenience, another conventional switching method has been proposed which comprises the steps of switching a saw-tooth wave of 50 Hz with a pulse wave having a frequency of 5 KHz, and feeding the switched signal to a tuning circuit of 5 KHz, thereby to obtain a sine wave signal.

According to this switching method, it is possible to eliminate the nonlinearity encountered with the modulating method, but another drawback will arise in that in regard to the waveform of a sign wave obtained from the tuning circuit, the amplitude on the side of positive-going swing and the amplitude on the side of negative-going swing are different with respect to a center line. As a result, a circle displayed as a Lissajous figure becomes distorted.

On the contrary, in accordance with a first embodiment of a spiral scanning device as shown in FIG. 1, the amplitude of the sine wave signal increases linearly every scanning period within a frame period, and a sine wave of which the amplitudes on the positive and negative-going swings are symmetrical with respect to the center line. Thus, the spiral scanning device according to the present invention makes it possible to draw on the screen of the CRT a spiral scan raster of which the scan line intervals are precisely divided into one hundred sections with respect to the radial direction and in which distortion is completely removed.

Figure 2:
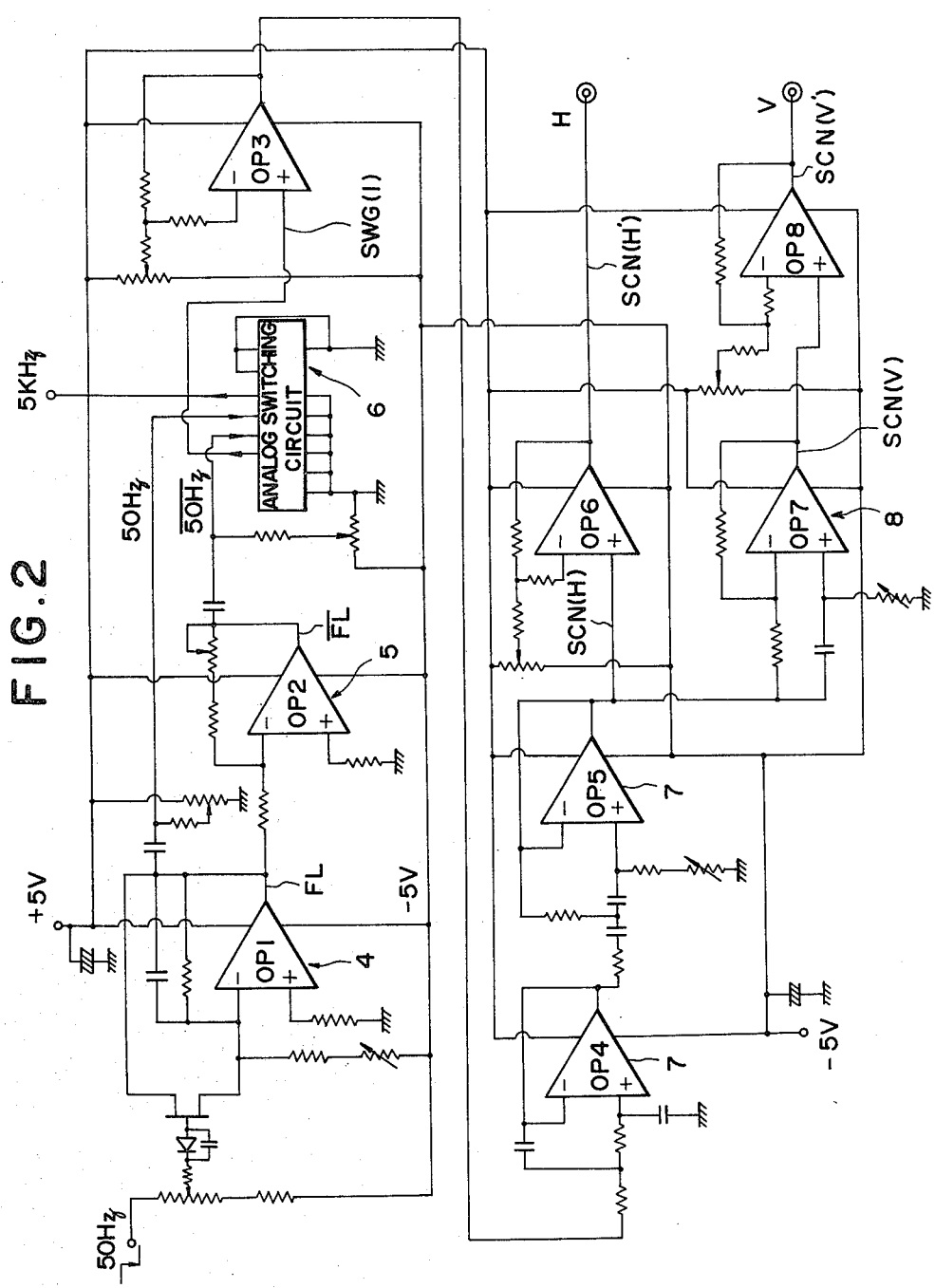
FIGS. 2 and 3 are views each illustrating details of the circuit construction shown in FIG. 1.

Referring to FIG. 2 illustrating details of the scanning circuit A shown in FIG. 1, OP1 to OP12 denote operational amplifiers each comprising transistors. OP1 denotes saw-tooth generator 4 producing a saw-tooth signal having a frequency of 50 Hz, OP2 invertor 5 for inverting the output of saw-tooth generator 4, and OP3 a voltage follower provided at the preceding stage of filter circuit 7 comprising operational amplifiers OP4 and OP5, wherein OP4 denotes a low pass filter and OP5 denotes a band pass filter. OP6 denotes a voltage follower whose output SCN(H′) serves as a signal H applied to the horizontal axis of the CRT. OP7 denotes phase shifter 8 for shifting the phase by 90°. This output SCN(V) of the phase shifter 8 is supplied to an input terminal of a voltage follower OP8 whose output SCN(V′) serves as a signal V applied to the vertical axis of the CRT.

Figure 3:
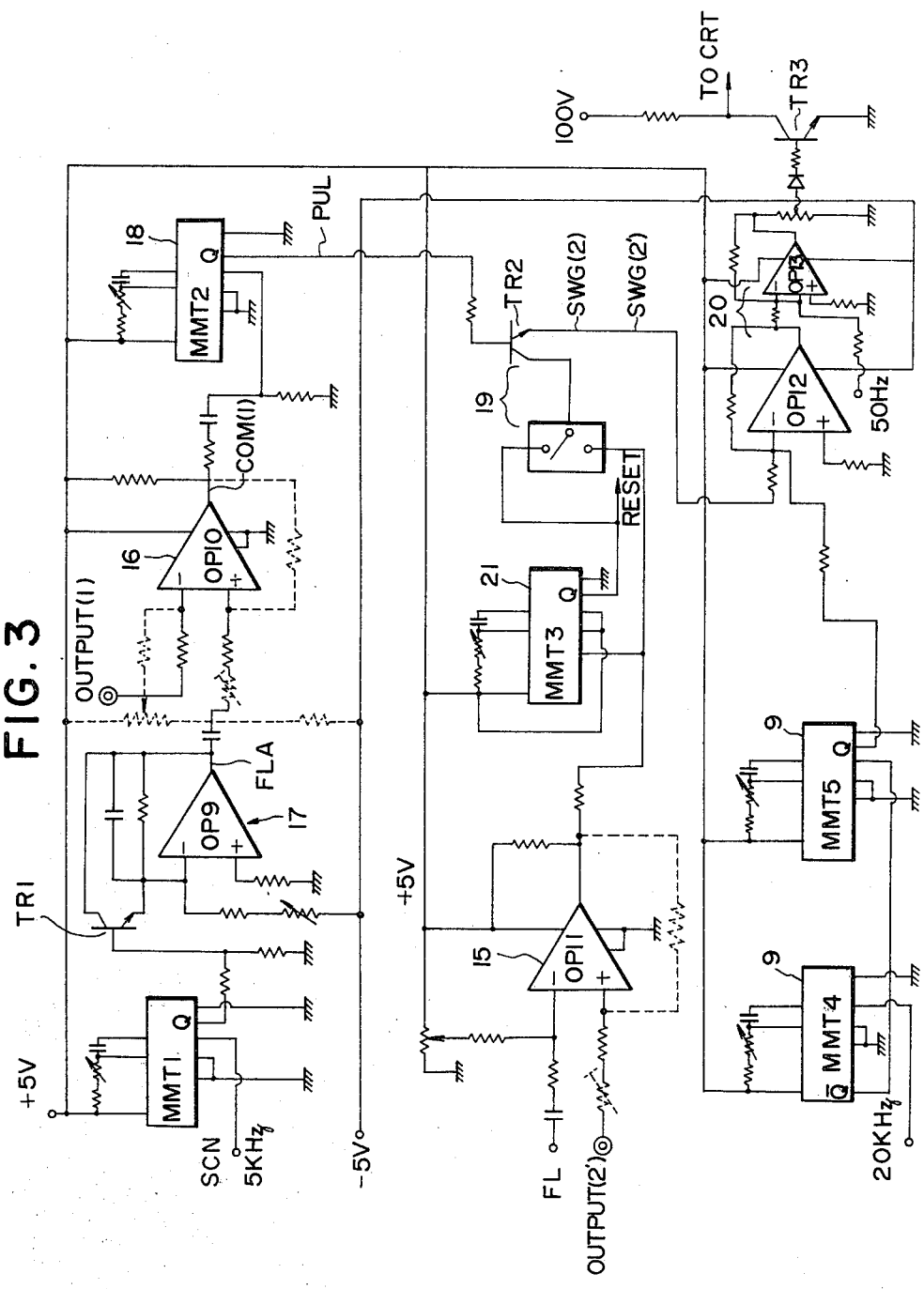
Figure 4:
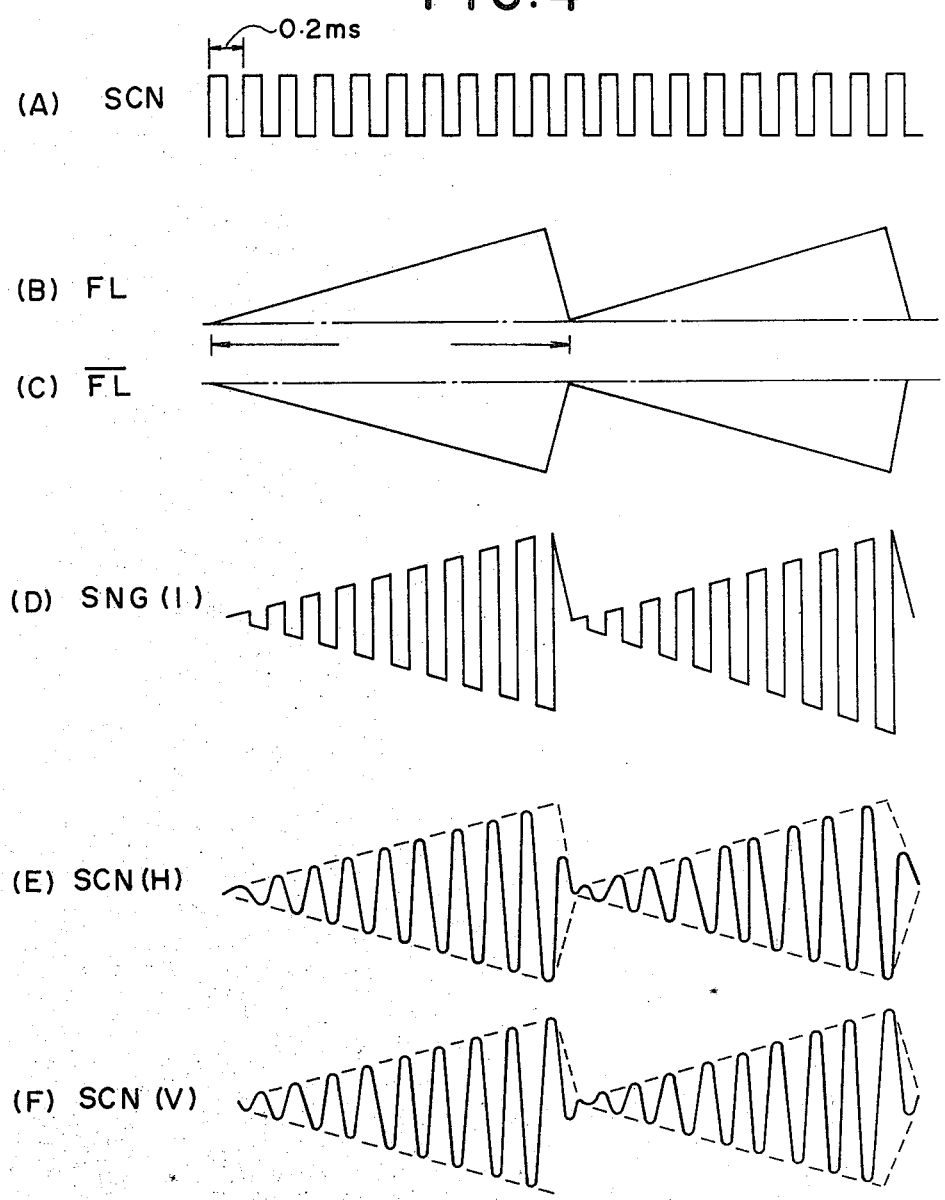
FIGS. 4 and 5 are time charts of FIG. 1.

Referring to FIG. 3 illustrating details of the brilliance modulation circuit shown in FIG. 1, OP9 denotes a saw-tooth generator producing a saw-tooth signal having a frequency of 5 KHz, OP10 and OP11 denote comparators 16 and 15, respectively, and OP12 and OP13 are operational amplifiers constituting adder 20.

MMT1 to MMT5 denote monostable multivibrators formed from integrated circuits, and TR1 to RT3 denote transistors.

Figure 5:
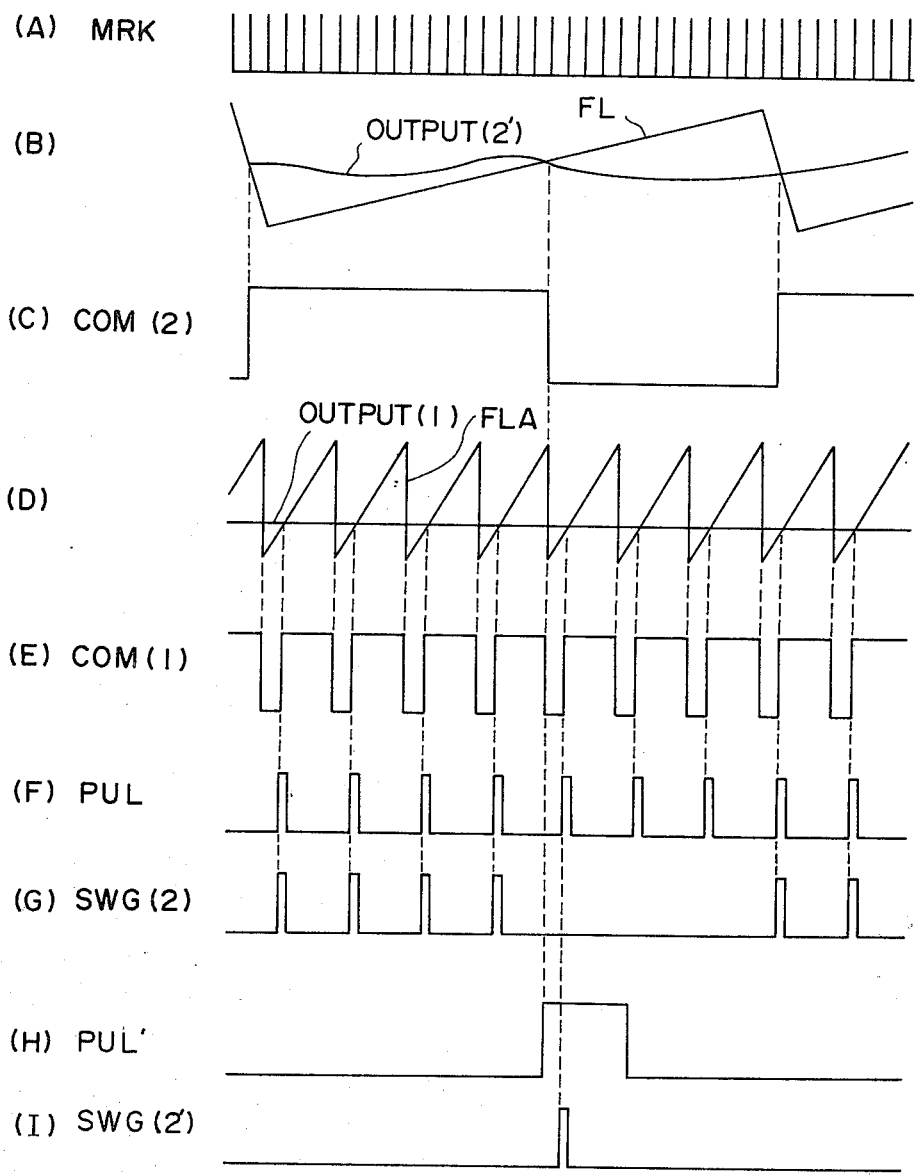

Reference is now made to the operation of the unit for measuring the directional characteristic of the test object and changing the measured results into the brilliance modulation signal with reference to a time chart shown in FIG. 5.

In order to carry out a polar coordinate representation on a screen of the CRT, a signal having a frequency of 20 KHz (period 0.05 ms) supplied from the oscillator 1 is inputted to an axial marker generator 9 to make an axial representation marking signal labelled by symbol MRK. This axial representation marking signal MRK is applied to the brilliance circuit, and thus a suitable scale pattern is drawn with graduation at the 0°, 90°, 180° and 270° positions.

For even finer polar coordinate representation, it is sufficient to attach a polar coordinate scale to the screen of the CRT. For the purpose of measuring the directivity of a test object 10, such as a speaker, there are provided a potentiometer 11 serving as a first detector and a second detector 12. The test object 10 is rotated at a given speed by a drive means (not shown). The potentiometer 11 produces a DC voltage signal proportional to the rotating angle 0° of the test object 10 to produce a corresponding output thereof.

The detector 12 produces a voltage signal proportional to the output at each angle of rotation. The output of the detector 12 is amplified by an amplifier 13, and then is converted by a rectifier 14 to a DC voltage signal OUTPUT(2') proportional to the output at each angular position of the test object 10.

It is to be noted that the circuit parameters of the amplifier 13 and the rectifier 14 are selected to that the maximum value of the DC voltage signal OUTPUT(2') is the same as that of the saw-tooth wave FL which varies with the same period as the frame period used when effecting a spiral scanning wave wherein the saw-tooth waveform FL is substantially the same as the saw-tooth wave output from the saw-tooth signal generator 4.

A comparator 15 compares the DC voltage signal output(2') with the saw-tooth wave FL. The output of the comparator 15 is outputted as a signal COM(2). This signal COM(2) may be considered as the signal corresponding to the output from the test object 10.

A comparator 16 compares the DC voltage signal from the potentiometer 11 with a saw-tooth wave FLA produced from a saw-tooth signal generator 17. The saw-tooth signal generator 17 is constituted so that the peak value of the saw-tooth wave FLA is equal to the DC voltage value from the potentiometer 11 detected when the rotational angle of the test object 10 is 360°.

The output COM(1) from the comparator 16 is changed into a signal PUL by a monostable multivibrator 18. This signal PUL serves as a signal corresponding to the rotational angle of the test object 10.

The signal COM(2) output from the comparator 15 is inputted to an analog switching circuit 19. The analog switching circuit 19 changes the output COM(2) of the comparator 15 into a signal SWG(2) in synchronization with the output PUL of the monostable multivibrator 18. This signal SWG(2) serves as a brilliance modulation signal for the directivity representation.

The mark signal MRK from the axis marking generator 9 and the signal SWG(2) from the analog switching circuit 19 are input to the adder 20, the output of which is supplied to a brilliance circuit (not shown).

Figure 6:
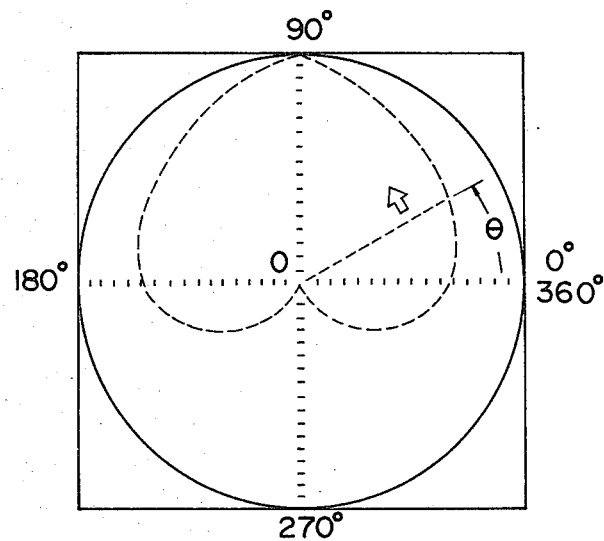
FIGS. 6 and 7 are graphs each illustrating a directional characteristic of a test object, which is depicted on a screen of a CRT with the device shown in FIG. 1.
Figure 7:
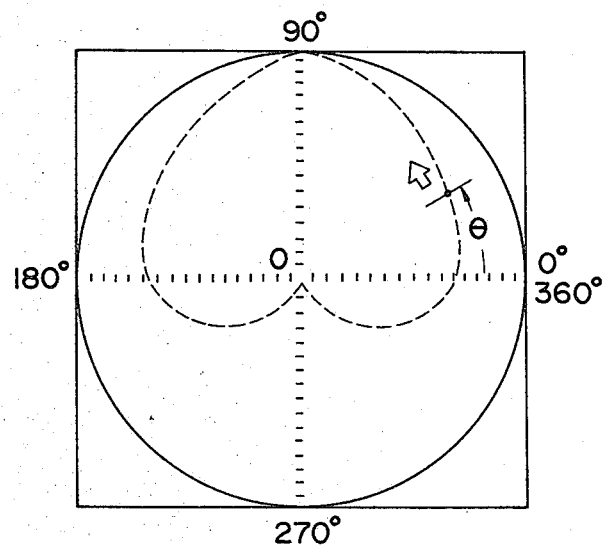

When the signal SWG(2) and the mark signal MRK are input to the brilliance circuit as shown in FIG. 6, a line is drawn from the central point 0 of the screen for the radial distance corresponding to the output level of the test object 10 for each rotational position thereof, superimposed on the scale pattern. A figure indicative of directivity is thus depicted when the test object 10 is turned through 360°.

Reference is now made to a modification of this embodiment of the present invention.

Referring to FIG. 1, reference numeral 21 denotes a second monostable multivibrator connected between the comparator 15 and the analog switching circuit 19. Thus, the output of the comparator 15 is inputted to the analog switching circuit 19 through the monostable multivibrator 21. The output PUL' of the monostable multivibrator 21 is switched in the analog switching circuit 19 gated by the output PUL of the monostable multivibrator 18. If the output of the analog switching circuit 19 thus obtained is served as a brilliance modulation signal of the CRT, the figure as shown in FIG. 5 will be obtained on the screen of the CRT. That is, the peak value of the output level of the test object at each angle of rotation is depicted as a spot. Thus the directivity is indicated by an outline graph, rather than a filled-in graph as in the first case. A figure indicative of directivity represented by the peak value is obtained by rotating the test object over 360°.

The size of the spot on the screen of the CRT is determined in accordance with the pulse width of the output signal PUL of the monostable multivibrator 18 in both cases, whether representing only the peak value, as an outline graph, or drawing radial lines, and producing a filled-in graph.

As is clear from the foregoing description, a polar coordinate display device according to the preferred embodiment of the present invention makes it possible to automatically depict directivity of a test object, such as an antenna, on a CRT screen thereby effecting direct viewing by rotating the test object through 360° at a given rotational speed.

Although reference has been made to the embodiment of the directivity display device with a polar coordinate representation, it should be noted that the present invention is applicable to display device with other coordinate representations.

For instance, in order to embody a display device with a Cartesian coordinate representation, it is sufficient to apply the output of the saw-tooth generator 4, which serves as a time base generator, to the axis of the CRT, as a scanning signal.

The display device with the Cartesian coordinate representation is particularly applicable in the event that great variation occurs in the characteristic output with respect to each rotational angle of the test object.

Reference is now made to a second embodiment of the polar coordinate display device of the present invention.

According to the first embodiment, it is inevitable that a certain amount of noise may be included in the signal OUTPUT(1) determining the rotational angle of the test object and the signal OUTPUT(2) obtained by detecting a characteristic of the test object.

Figure 8:
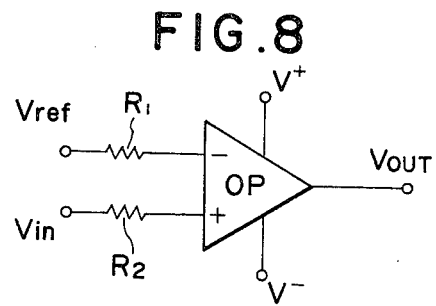
FIG. 8 is a circuit construction of a conventional comparator.
Figure 9:
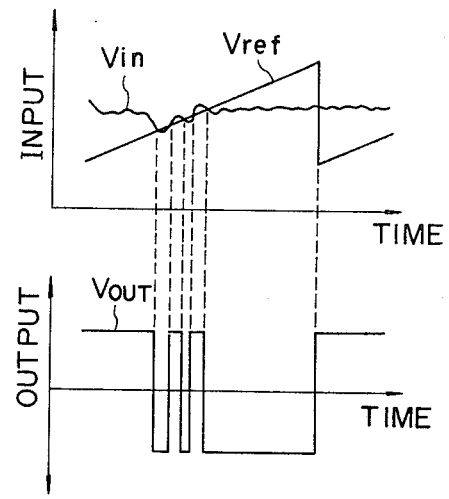
FIG. 9 is a view illustrating a waveform of the comparator shown in FIG. 8.

More particularly, when these signals OUTPUT(1) and OUTPUT(2) are compared in comparators 16 and 15, this noise interference can cause positive and negative oscillations in the vicinity of the reference voltage in the output waveform of the comparators A detailed discussion will proceed with reference to FIGS. 8 and 9.

OP denotes an operational amplifier constituting a comparator, V+ and V− positive and negative DC voltages respectively, for driving the operational amplifier, Vref a reference signal, and Vin an input signal. The reference voltage Vref is input to the inverting terminal of the operational amplifier OP through a resistor $R_1$.

The input voltage Vin is inputted to the non-inverting terminal of the operational amplifier OP through a resistor $R_2$. Vout denotes the output signal. According to the relationship between the input signal Vin and the reference signal Vref, when Vin<Vref holds, a negative saturated voltage V− is outputted, while when Vin>Vref holds, a positive saturated voltage V+ is outputted as an output Vout. However, in the event that noise interference in the vicinity of the voltage Vref, as shown in FIG. 1, the output signal Vout fluctuates according to the noise voltage.

In view of eliminating these undesirable phenomena, the feature of this embodiment of the present invention resides in rendering a hysteresis width larger than that of the noise voltage to the comparator.

Figure 10:
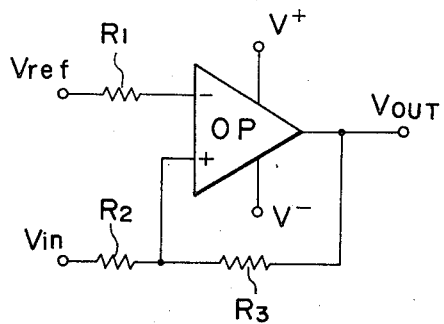
FIG. 10 is a circuit construction of a comparator according to the present invention.

As best shown in FIG. 10, the output terminal of the operational amplifier OP is connected to the noninverting input terminal thereof through a resistor $R^3$.

Adding the resistor R3 to the operational amplifier makes it possible to render a predetermined hysteresis thereto, thereby enabling the fluctuation due to the noise to be suppressed.

Figure 11:
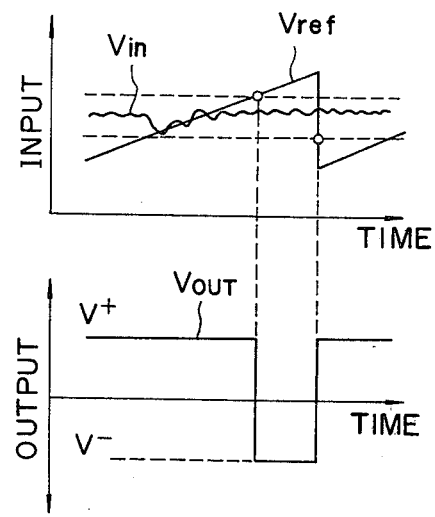
FIG. 11 is a view illustrating a waveform of the comparator shown in FIG. 10.

FIG. 11 shows an output signal Vout of a comparator according to this embodiment when the same input and reference signal as used in FIG. 9 are applied to the comparator shown in FIG. 10. In this case, the width $V_H$ of the hysteristis is expressed as follows;

$$V_H = \frac{R_2}{R_2 + R_3} \cdot (V^+ - V^-)$$

Accordingly, it is sufficient to set the resistance values of the resistors $R_2$ and $R^3$ so that the value of $V_H$ is above the predetermined value.

An addition of the comparator according to this embodiment to the circuit of the first embodiment makes it possible to provide a polar coordinate display device capabling of withstanding noise disturbances and effect a distinctive display on the CRT.

Although the invention has been described with respect to its preferred embodiments, it is apparent that various changes and modification are possible without departing from the spirit and scope of the invention.

We claim:

1. A device for displaying in graphic form a property of an object as a function of an attribute of that object, comprising a scanning circuit including a first saw-tooth generator producing a scan signal and means for measuring a directional property of the object and converting a measurement signal into a brilliance modulation signal, including:
   (a) a first detector for generating a first signal proportional to the attribute of the object,
   (b) a second detector for generating a second signal indicating the current value of the property of the object,
   (c) a second saw-tooth generator for generating a saw-tooth wave signal,
   (d) a first comparator which compares the output of said first detector with said saw-tooth wave signal generated by the second saw-tooth generator to produce an output when said saw-tooth wave signal of said second saw-tooth generator is above the signal generated by said first detector,
   (e) a second comparator which produces a signal dependent on the output of said first saw-tooth generator and the output of said second detector,
   (f) a first pulse generator responsive to the output of said first comparator to produce pulses, and
   (g) a switching circuit for switching the output of said second comparator gated by the pulses output from said first pulse generator to produce an output serving as a brilliance modulated signal.

2. The device of claim 1 in which the attribute of the object detected by said first detector is its rotational position.

3. The device of claim 2 in which the property detected by said second detector is plotted in a polar coordinate frame.

4. The device of claim 3 in which the plotting in a polar coordinate frame is accomplished by means of a spiral scan.

5. The device of claim 4 including a spiral scan circuit comprising:
   (a) an invertor which inverts the output of the first saw-tooth generator,
   (b) a switching circuit included in said scanning circuit for switching the output of the first saw-tooth generator and the output of the invertor in synchronization with a signal related to the period of the circumferential scan, to produce a first sine wave signal having an amplitude that increases linearly every scan period within a frame period,
   (c) an output circuit outputting the first sine wave signal directly to one axis of the cathode-ray tube and a second sine wave signal having a phase that is shifted by 90° with respect to the first sine wave signal to the other axis of the cathode-ray tube.

6. The device of claim 5 in which the second analog switching circuit includes a band pass filter for producing the first sine wave.

7. The device of any of claims 1 to 6 in which the first pulse generator comprises a monostable multivibrator.

8. The device of any of claims 1 to 6 in which the second comparator produces a signal only when the output of the second detector is above the output of the first saw-tooth generator.

9. The device of any of claims 1 to 6 in which the second comparator comprises a first stage which produces a signal only when the output of the second detector is above the output of the first saw-tooth generator and a second stage which receives as an input the output from the first stage and outputs pulses in response to changes in the output from the first stage.

10. The device of any one of claims 1 to 6, in which each of said first and second comparators includes an operational amplifier.

11. The device of claim 10, wherein a reference signal/Vref is applied to an inverting input terminal of the operational amplifier while an input signal/Vin is applied to a non-inverting input terminal of the operational amplifier through a second resistance and an output terminal of the amplifier is connected to the non-inverting input terminal through a third resistance, whereby a predetermined width of hysteresis is rendered in the output characteristic of the operational amplifier in accordance with the resistance value of said second and third resistors.

12. The device of claim 7 in which the second comparator produces a signal only when the output of the second detector is above the output of the first saw-tooth generator.

13. The device of claim 7 in which the second comparator comprises a first stage which produces a signal only when the output of the second detector is above the output of the first saw-tooth generator and a second stage which receives as an input the output from the first stage and outputs pulses in response to changes in the output from the first stage.

14. The device of claim 7 in which each of said first and second comparators comprises an operational amplifier.

15. The device of claim 14, wherein a reference signal/$V_{ref}$ is applied to an inverting input terminal of the operational amplifier while an input signal/$V_{in}$ is applied to a non-inverting input terminal of the operational amplifier through a second resistance and an output terminal of the amplifier is connected to the non-inverting input terminal through a third resistance, whereby a predetermined width of hysteresis is rendered in the output characteristic of the operational amplifier in accordance with the resistance value of said second and third resistors.

16. A device for displaying in graphic form a property of an object as a function of an attribute of that object, comprising:
- a first saw-tooth generator producing a scan signal;
- a first detector for generating a first signal proportional to the attribute of the object;
- a second detector for generating a second signal indicating the property of the object;
- a second saw-tooth generator for generating a saw-tooth wave signal;
- a first comparator for generating an output signal in response to the first signal and saw-tooth wave signal;
- a second comparator for generating an output in response to the second signal and scan signal; and
- output signal generating means responsive to the outputs of said first comparator and said second comparator to produce a brilliance modulated output signal.

17. A method for displaying in graphic form a property of an object as a function of an attribute of that object, comprising the steps of generating a first saw-tooth scan signal; measuring a directional property of the object; generating a first signal proportional to the attribute of the object; generating a second signal indicating the property of the object; generating a second saw-tooth wave signal; comparing the first signal with the second saw-tooth wave signal to produce a first output signal; comparing the first saw-tooth scan signal with the second signal to produce a second output signal; and combining said first and second output signals to develop a brilliance modulated signal.

18. The method of claim 17 wherein said combining step includes generating pulses in response to the first output signal and switching the second comparison signal in response to said pulses.

* * * * *